United States Patent [19]

Choi

[11] Patent Number: 6,078,530
[45] Date of Patent: Jun. 20, 2000

[54] REFERENCE VOLTAGE GENERATOR FOR A FERROELECTRIC MATERIAL MEMORY DEVICE

[75] Inventor: Ja Moon Choi, Ichon, Rep. of Korea

[73] Assignee: Hyundai Electronics Industries Co., Ltd., Kyoungki-do, Rep. of Korea

[21] Appl. No.: 09/206,308

[22] Filed: Dec. 7, 1998

[30] Foreign Application Priority Data

Dec. 24, 1997 [KR] Rep. of Korea ............ 97-73412

[51] Int. Cl.[7] .................................................. G11C 7/00
[52] U.S. Cl. ................................ 365/189.09; 365/145
[58] Field of Search ........................ 365/189.09, 145, 365/65, 202, 203, 210

[56] References Cited

U.S. PATENT DOCUMENTS

| | | | |
|---|---|---|---|
| 5,572,459 | 11/1996 | Wilson et al. | 365/145 |
| 5,663,904 | 9/1997 | Arase | 365/145 |
| 5,737,260 | 4/1998 | Takata et al. | 365/145 |
| 5,754,466 | 5/1998 | Arase | 365/145 |
| 6,026,009 | 2/2000 | Choi | 365/145 |

*Primary Examiner*—A Zarabian
*Attorney, Agent, or Firm*—Nath & Associates; Gary M. Nath; Harold L. Novick

[57] ABSTRACT

A reference voltage generator for a ferroelectric materialmemory device alternately stores a reference data stored in one pair of reference cells, and thus enhances a durability of a chip. The reference cell portion is connected between two reference bit lines. It has first and second reference cells to store reference voltages. Precharge portion removes a voltage difference at the first reference cell and a voltage difference at the second reference cell by the process of the precharging operation over the two reference bit lines. Reference bit line equalizer performs a charge division operation over the two reference bit lines. Reference cell data controller is connected between the two reference bit lines for alternately changing data within the first and the second reference cells. Reference cell data control signal generator generates first and second reference cell data control signals to control the operation of the reference cell data controller. As a result, the reference voltage generator reduces a characteristic deterioration caused by a fatigue by alternately changing a polarization status of the reference cells, thereby enhancing a durability of a memory chip.

6 Claims, 10 Drawing Sheets case2 ('1'to'1'write)

REFERENCE VOLTAGE GENERATOR FOR A FERROELECTRIC MATERIAL MEMORY DEVICE

BACKGROUND OF THE INVENTION

1. Field of the Invention

The present invention relates to a reference voltage generator for a ferroelectric material memory device. More particularly, it relates to a reference voltage generator for a ferroelectric material memory device which alternately stores a reference data stored in one pair of reference cells of a reference voltage generator of a ferroelectric material memory element, thus enhancing the durability of the memory chip.

2. Description of the Prior Art

Conventionally, a memory device made of ferroelectric material has a characteristic of maintaining a constant electric charge quantity even if no potential difference exists between both ends of a ferroelectric capacitor. Thus, a non-volatile memory can be manufactured by using this characteristic.

FIG. 1A represents a symbol of a capacitor made of a ferroelectric material; and FIG. 1B is a hysteresis loop illustrating a relationship between voltage and charge quantity of the ferroelectric material capacitor shown in FIG. 1A.

As shown in the hysteresis loop of FIG. 1B, although there is no potential difference between both ends (a and b) of the ferroelectric material capacitor of FIG. 1A, the ferroelectric material capacitor storing data "1" can be present in polarization status P1, and the ferroelectric material capacitor storing data "0" can be present in polarization status P3.

If a sufficient negative voltage is applied to both ends (a and b) of the ferroelectric material capacitor in order to read a stored data, a polarization status of the ferroelectric material capacitor storing the data "1" is changed from a first polarization status P1 to a second polarization status P2 along the hysteresis loop, so that the ferroelectric material capacitor generates a charge by Qm1. Thereafter, if a voltage difference between both ends (a and b) is removed (i.e., becomes zero), the second polarization status P2 is changed to a third polarization status P3. Thereafter, the third polarization status P3 returns to the first polarization status P1 by the prosecution of the process of a data restoring step.

A polarization status of the ferroelectric material capacitor storing the data "0" changes from the third polarization status P3 to the second polarization status P2, so that the ferroelectric material capacitor generates a charge by Qm0. Then, the second polarization status P2 returns to the original status (i.e., the third polarization status P3) after performing a data restoring step.

In this case, a memory for storing a binary data can be constituted by sensing the difference between the two charge quantities of Qm1 and Qm0.

Various memory types have been constituted by using the above characteristic of the ferroelectric material capacitor.

FIG. 2 schematically illustrates a fatigue phenomenon having occurred in the ferroelectric material capacitor. As shown in FIG. 2, a hysteresis loop of an initial state ferroelectric material capacitor is indicated as a solid line. If a sufficient negative voltage is applied to the ferroelectric material capacitor, the ferroelectric material capacitor generates a charge by Q0.

A status of a deteriorated ferroelectric material capacitor, which is caused by many uses of a cell, is indicated as a dotted line in FIG. 2. However, as shown in Q1 of FIG. 2, a charge attenuation is gradually generated in the deteriorated ferroelectric material capacitor.

FIG. 3 is a circuit diagram of a conventional ferroelectric material memory device.

Referring to FIG. 3, if the conventional ferroelectric material memory device turns on a gate terminal of a switching transistor in order to read a stored data and is then driven by a plate voltage of a high level, each of bit lines has different voltages V0 and V1 in response to the data type (i.e., "0" or "1") stored in the cell.

Since the voltages V0 and V1 are small-signals, the voltages V0 and V1 should be amplified by using a sense amplifier.

In order to amplify the voltages V0 and V1, a reference voltage between the voltages V0 and V1 should be applied to a bit line bar.

That is, the conventional ferroelectric material memory device determines whether the voltage V0 or V1 of the bit line is lower or higher than the reference voltage applied to the bit line bar by using the sense amplifier. Thereafter, it determines whether the cell data is "0" or "1".

For reference, a typical reference voltage generator for making a reference voltage is disclosed in the Institute of Electrical and Electronic Engineers (IEEE) Solid Static Circuit, Vol.31, No.11, November 1996, pp.1625–1633.

Frequency of use of a reference cell used in the reference voltage generator becomes more increased in proportion to the number of cells within the memory cell array since the typical art uses only one reference voltage generator for a bit line of a memory cell array.

The ferroelectric material capacitor has a fatigue phenomenon wherein a holding charge quantity of the capacitor has a negative correlation with the number of times the capacitor is used. Therefore, the voltage value is also changed with the decrease of the charge quantity.

A reference voltage generator 20 shown in FIG. 3 always stores the data "0" in a capacitor C1, always stores the data "1" in a capacitor C2, and repeatedly reads these data. Accordingly, as the number of the times of the uses of the capacitors C1 and C2 is increased, the charge quantity decreases and a generated voltage value is also changed. Therefore, it is difficult to ensure a sensing margin in the conventional art, thereby lowering a reliability of a memory element.

In more detail, as shown in FIG. 4A which illustrates a signal diagram for driving the prior reference voltage generator, the ferroelectric material capacitor C1 storing the data "0" during a read/write operation repeats only a status of c→b→c, so that a capacitor's deterioration is seldom caused by the number of times of the use.

On the contrary, since the ferroelectric material capacitor C2 storing the data "1" repeats a status of a→b→c→d→a for every read/write operation, a charge attenuation caused by the fatigue phenomenon is easily generated as compared with the capacitor C1. Accordingly, as the number of times of the use of the capacitor C2 increases, it is difficult to ensure the sensing margin of the capacitor. Thereby, the reliability of the entire chip is downed, as shown in FIG. 4B which illustrates a voltage relation between both ends of the ferroelectric material capacitor by a driving signal.

Assuming that 1,024 memory cells are all connected to one reference voltage generator, a cell being used in the reference voltage generator can be deteriorated faster than a general memory cell by 1,024 times.

SUMMARY OF THE INVENTION

Accordingly, the present invention is directed to a reference voltage generator for a ferroelectric material memory device that substantially obviates one or more of the problems due to limitations and disadvantages of the related art.

It is an object of the present invention to provide a reference voltage generator for a ferroelectric material memory device that alternately stores data "0" and "1" into the reference cells used in a reference voltage generator of a ferroelectric material memory device. The embodiment of the present invention improves the reference cell's characteristic drop caused by a fatigue phenomenon, thereby enhancing a durability and a reliability of a chip.

To achieve the above object, a ferroelectric material memory device according to the present invention includes: a reference cell portion connected between two reference bit lines, said reference cell portion has first and second reference cells to store reference voltages; a precharge portion for removing a voltage difference at the first reference cell and a voltage difference at the second reference cell by the process of the precharging operation over the two reference bit lines; a reference bit line equalizer for performing a charge division operation over the two reference bit lines; a reference cell data controller connected between the two reference bit lines for alternately changing data within the first and the second reference cells; and a reference cell data control signal generator for generating first and second reference cell data control signals to control the operation of the reference cell data controller.

Additional features and advantages of the invention will be set forth in the description which follows, and in part will be apparent from the description, or may be learned by practice of the invention. The objective and other advantages of the invention will be realized and attained by the structure particularly pointed out in the written description and claims thereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENTS

A preferred embodiment of the present invention will now be described in detail with reference to the accompanying drawings.

Figure 5:
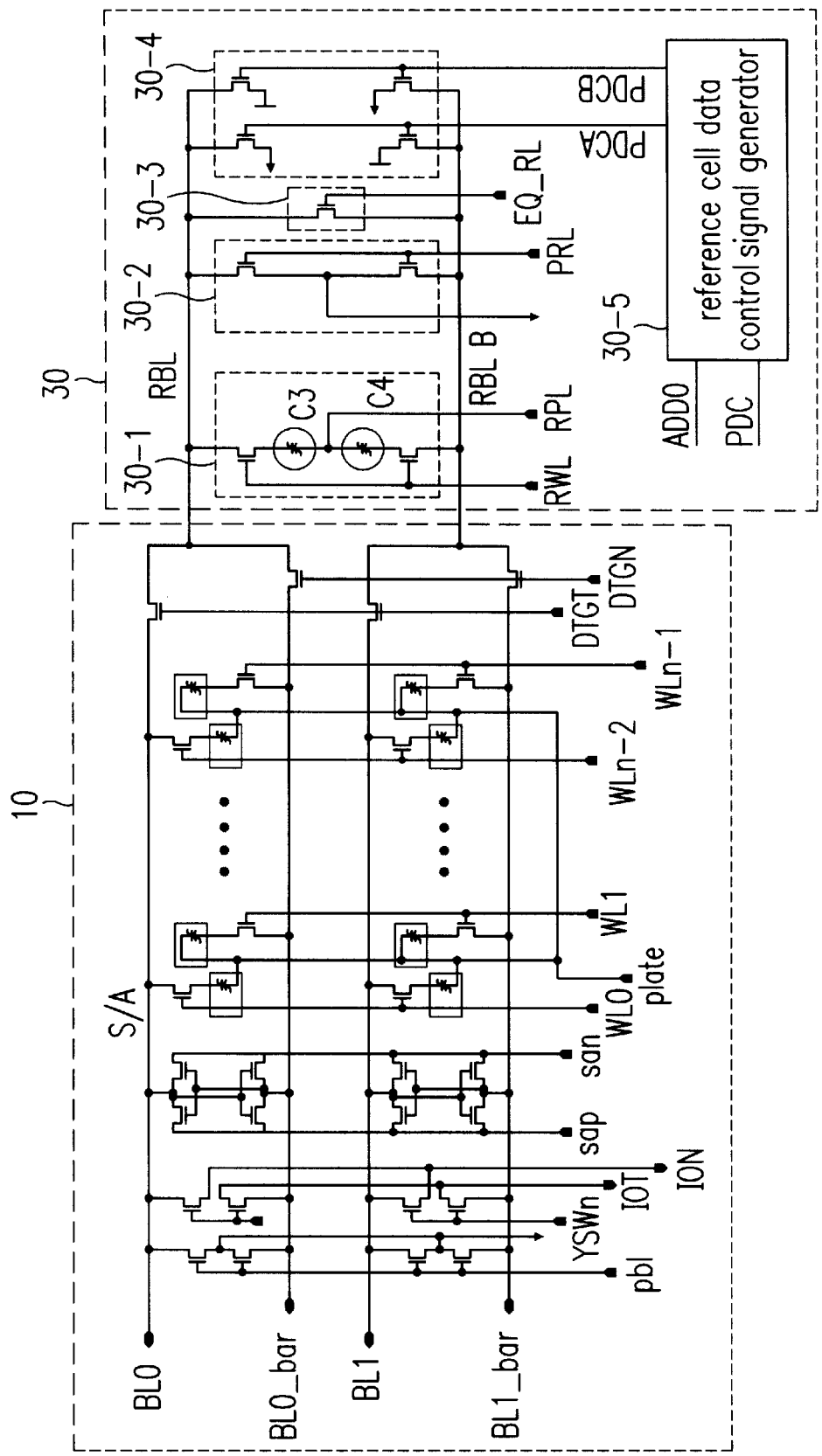
FIG. 5 is a circuit diagram illustrating a memory cell array and a reference voltage generator in accordance with the present invention.

FIG. 5 is a circuit diagram illustrating a memory cell array and a reference voltage generator in accordance with the present invention.

As shown in FIG. 5, a reference voltage generator 30 for outputting a reference voltage to a memory cell array 10 includes: a reference cell portion 30-1 which is connected between reference bit lines, and stores data for making a reference voltage by using a reference word line driving signal RWL and a reference plate line driving signal RPL; a precharge portion 30-2 which is connected between the reference bit lines, and is driven by a precharge driving signal PRL, precharges the referee bit lines with a ground level, and thus eliminates a voltage difference between both ends of the ferroelectric material capacitor; a reference bit line equalizer 30-3 which is connected between the reference bit lines, is driven by an equalizing signal EQ-RL, and performs a charge division of the reference bit lines; a reference cell data controller 30-4 which is connected between the reference bit lines in order to enhance the durability of the ferroelectric material capacitor of the reference cell portion 30-1, is driven by a first reference cell data control signal PDCA and a second reference cell data control signal PDCB, and makes data 0 and 1 stored in the reference cell portion 30-1 be alternately stored; and a reference cell data control signal generator 30-5 which is driven by a low order address ADD0 and a reference cell data driving signal PDC, and outputs first and second reference cell data control signals PDCA and PDCB for controlling an operation of the reference cell data controller 30-4.

The reference cell portion 30-1 includes two NMOS transistors and two ferroelectric material capacitors C3 and C4. Gate terminals of the two transistors are commonly coupled and receive a reference word line driving signal RWL and each one terminal of the transistors is respectively connected to a reference bit line and a reference bit line bar. Each one terminal electrode of the two ferroelectric material capacitors C3 and C4 is respectively connected to the other terminals of the two transistors, and the other terminal electrodes of the two capacitors are simultaneously coupled to a reference plate line RPL.

The precharge portion 30-2 includes two NMOS transistors. Gate terminals of the two transistors are commonly coupled and receive a precharge driving signal PRL and each one terminal of the transistors is respectively connected to a reference bit line and a reference bit line bar. The other terminal electrodes of the two transistors are commonly coupled to a ground voltage terminal.

The reference bit line equalizer 30-3 includes NMOS transistor. The gate terminal of the NMOS transistor receives an equalizing signal EQ-RL as an input, and is connected between the two reference bit lines.

The reference cell data controller 30-4 includes first to fourth NMOS transistors. The gate terminals of the first and the second transistors are commonly coupled to a first reference cell data control signal PDCA. Each one terminal of the first and the second transistors are respectively connected to the two reference bit lines and the other terminals are respectively connected to a power-supply terminal and a ground voltage terminal. The gate terminals of the third and the fourth transistors are commonly coupled to a second reference cell data control signal PDCB. Each one terminal of the third and the fourth transistors are respectively connected to the two reference bit lines and the other terminals are respectively connected to a ground voltage terminal and a power-supply terminal.

Figure 7:
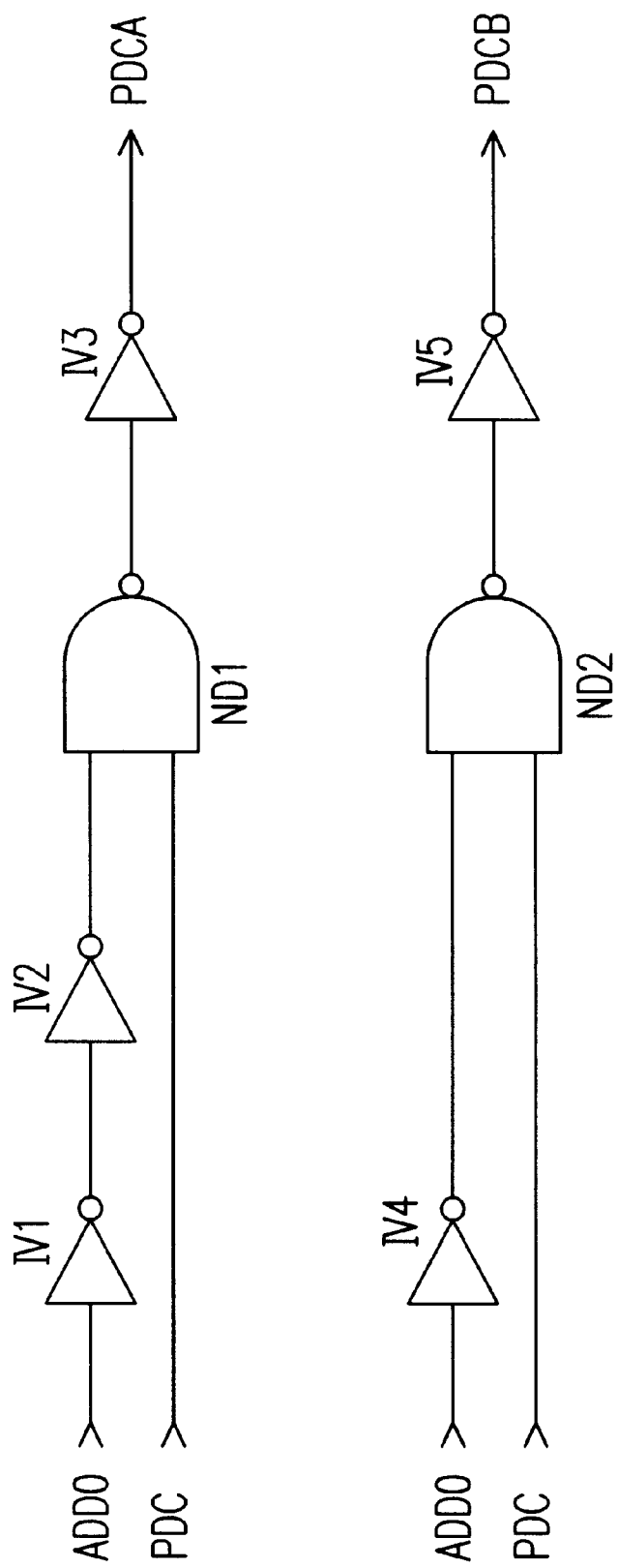
FIG. 7 is a detailed circuit diagram of a PDC selector—a reference cell data control signal generator—for generating signals which selectively drive transistors within the reference voltage generator in accordance with the present invention.

FIG. 7 is a detailed circuit diagram of a PDC selector (i.e., a reference cell data control signal generator) for generating signals PDCA and PDCB which selectively drive two pairs of NMOS transistors of a reference voltage generator in accordance with the present invention.

As shown in FIG. 7, the reference cell data control signal generator 30-5 includes first and second inverters IV1 and IV2 which are connected in series to each other in order to have the same phase as the low order address ADD0; NAND gate ND1 which receives an output signal from the second inverter IV2 and a reference cell data driving signal PDC, and performs a NAND operation about them; a third inverter IV3 which generates a first reference cell data control signal PDCA by inverting an output signal of the first NAND gate ND1; a fourth inverter IV4 for inverting the low order address ADD0; a second NAND gate ND2 which receives an output signal of the fourth inverter IV4 and the reference cell data driving signal PDC, and performs a logic operation about them; and a fifth inverter IV5 which generates a second reference cell data control signal PDCB by inverting an output signal of the second NAND gate ND2.

Figure 8A:
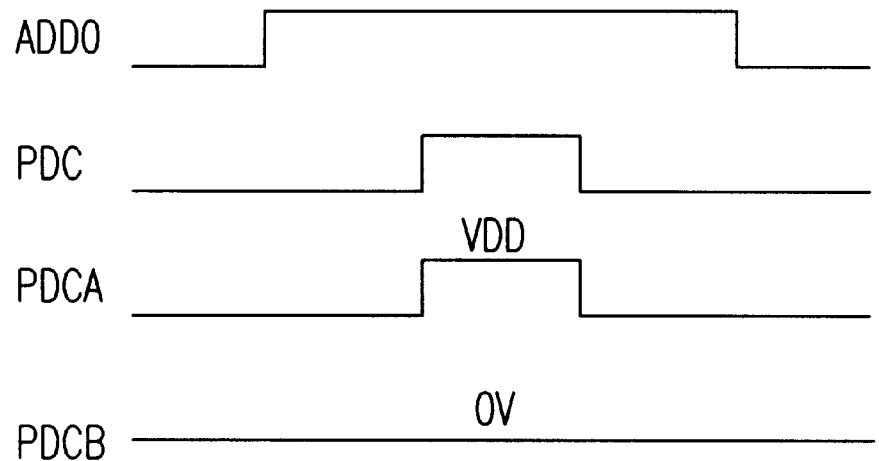
FIGS. 8A–8B are a signal diagram illustrating an operation of the reference cell data control signal generator.
Figure 8B:
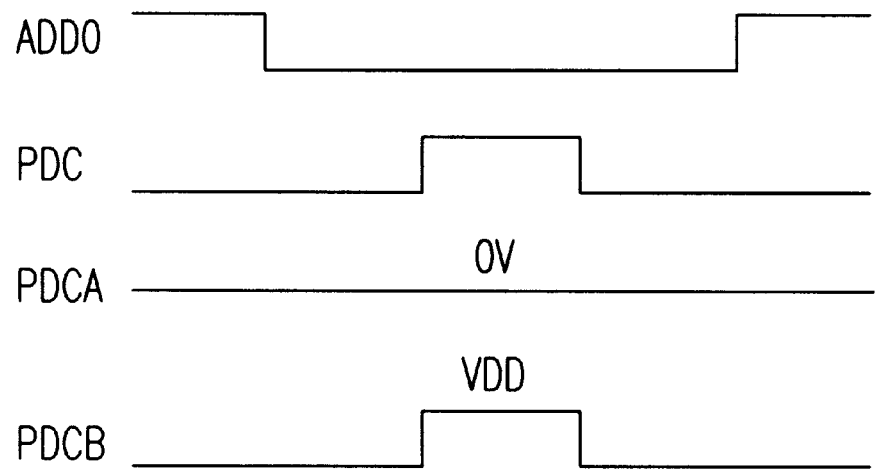

Operations of the reference cell data control signal generator 30-5 will now be described with reference to FIGS. 7 and 8.

If the low order address ADD0 is at a high level, one input terminal of a first NAND gate ND1 for generating the first reference cell data control signal PDCA is at a high level through output signals of the first and second inverters IV1 and IV2. Thereafter, if the reference cell data driving signal PDC for storing a data in the reference cell is at a high level with a given width similiar to the conventional circuit, the first reference cell data control signal PDCA generates the same phase signal as the reference cell data driving signal PDC. Therefore, during the time period wherein the phase signal of the first reference cell data control signal PDCA is identical with that of the reference cell data driving signal PDC, the data "0" is stored in the reference cell C3, and the data "1" is stored in the reference cell C4.

On the contrary, one input terminal of the second NAND gate ND2 for generating the second reference cell data control signal PDCB is at a low level if the low order address ADDO is at a high level, the second reference cell data control signal PDCB is always at a low level, therefore, the third and fourth NMOS transistors will maintain a turn-off state.

In the meantime, if the low order address ADDO is at a low level, gate terminals of the first and second NMOS transistors connected to the first reference cell data control signal PDCA are turned off, and gate terminals of the third and fourth NMOS transistors connected to the second reference cell data control signal PDCB are turned off, the data "1" is stored in cell C3 and the data "0" is stored in cell C4.

As stated above, if a reference cell is alternatively selected in response to a variation of the address ADD0 every data reading operation, the data "0" and "1" are alternately stored in each reference cell with about the same number of cases. Accordingly, as each reference cell stores the data "0" and "1" alternatively, an excessive characteristic deterioration phenomenon in the reference cells storing the data "1" are divided into two cells, thereby enhancing a durability of the reference cells.

A detailed description of the above operation will now be explained below with reference to FIGS. 6A–6B.

Figure 6A:
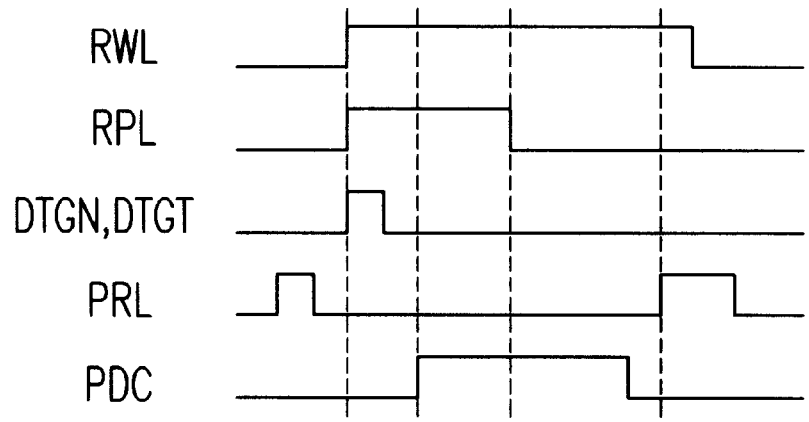
FIGS. 6A–6B illustrate a signal diagram for driving the reference voltage generator in accordance with the present invention, and a voltage relation between both ends of the ferroelectric material capacitor by a driving signal in accordance with the present invention.
Figure 6A:
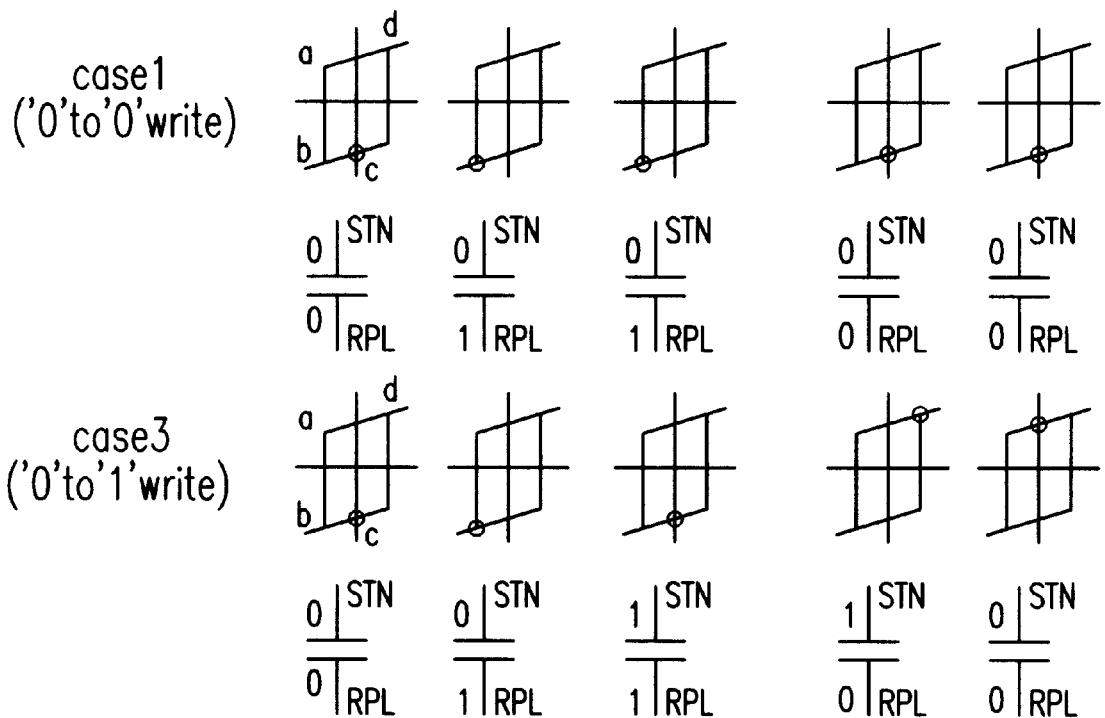
Figure 6B:
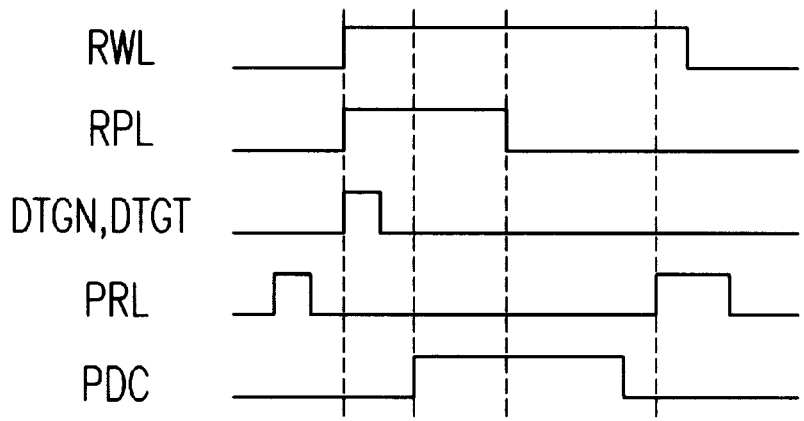
Figure 6B:
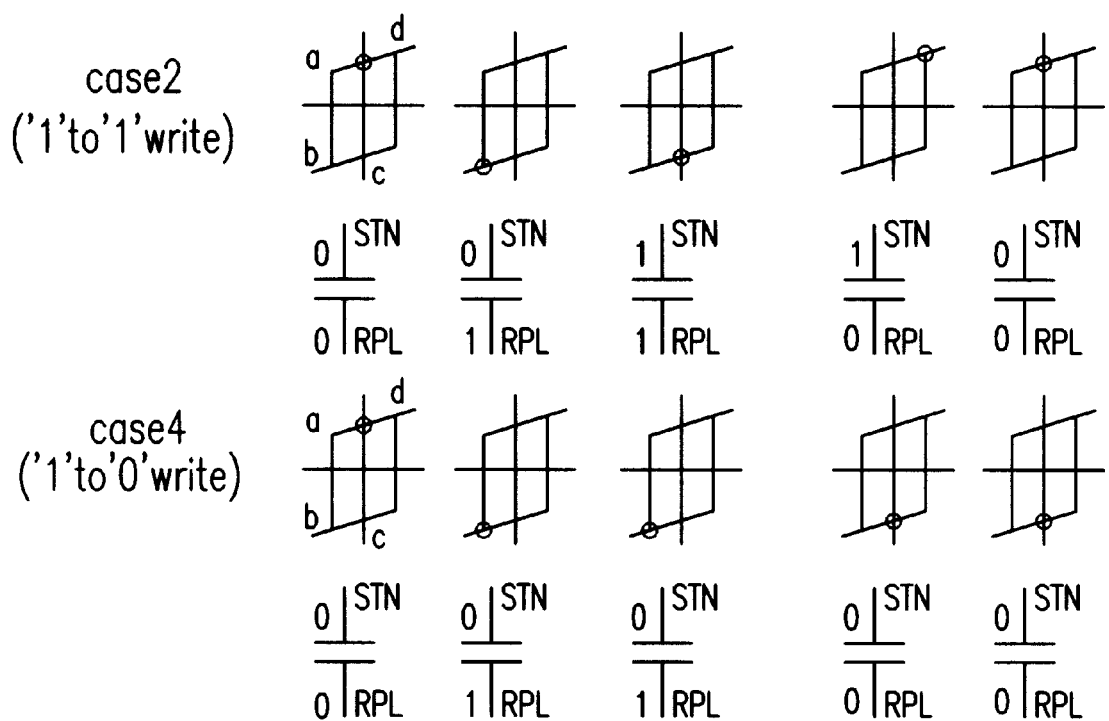

For a better understanding of four kinds of hysteresis loops shown in FIGS. 6A–6B, an electric potential being applied to both ends of the ferroelectric material is indicated under each hysteresis loop.

Herein, the data "0" means a logic low value, and the data "1" means a logic high value. In addition, a reference plate line is indicated as an abbreviation RPL, and a storage node is indicated as an abbreviation STN.

The case 1 shows that a data value before storing a reference cell data is "0" and the data "0" is then stored again.

In case 1, if a reference word line driving signal RWL and a reference plate line driving signal RPL are driven, a polarization status of the ferroelectric material becomes changed from point c to point b. If the data "0" is stored in the reference cell by a reference cell data driving signal PDC, a polarization status continuously maintains point b.

Thereafter, if the reference plate line driving signal RPL is turned off, each voltage difference between both ends of the ferroelectric material becomes 0 Volt(V), and the polarization status is changed to point c. Then, although a potential of a reference bit line is 0 Volt(V) because the reference plate line driving signal RPL is enabled under the reference word line driving signal RWL of a high state, the polarization status continuously maintains the point c.

The case 2 shows that the data "1" is stored in a reference cell prior to a reading operation, and the data "1" is restored in the reference cell. In the case 2, an initial polarization status is positioned at point a because the reference cell stores the data "1". If the reference word line driving signal RWL and the reference plate line driving signal RPL are driven, the polarization status changes from point a to point b. If a high level signal is applied to the storage node STN since the reference cell data driving signal PDC is driven, the polarization status changes from the point b to a point c.

Then, if the reference plate line driving signal RPL is disabled and the reference cell data driving signal PDC is continuously maintained at a high level, the polarization status becomes changed to point d. If the reference cell data driving signal PDC is disabled and the reference bit line becomes 0 Volt(V) by a precharge driving signal PRL, the polarization status returns to point a, therefore the data "1" is restored in the reference cell.

The case 3 shows that the data "0" is stored in a reference cell prior to a reading operation, and the data "0" is stored in case of storing data "1".

In case 3, an initial state is positioned at point c. If the reference word line driving signal RWL and the reference plate line driving signal RPL are driven, the polarization status changes from point c to point b. Then, if the data "1" is stored in the STN by the reference cell data driving signal PDC, there is no voltage difference between both ends of the cell, therefore, the polarization status returns to point c.

After that, if the reference plate line driving signal RPL is disabled and the reference cell data driving signal PDC is maintained at a high level, a polarization status is positioned at point d. Then, if the reference bit line becomes 0 Volt(V) by the precharge driving signal PRL, the polarization status changes from point c and point a, and thus the data "1" is stored (See FIGS. 5 and 6A).

The case 4 shows that the data "0" is stored when an initial value of the reference cell is "1". In case 4, since an initial value of the reference cell is "1", a polarization status is positioned at point a. The reference word line driving signal RWL and the reference plate line driving signal RPL are driven, the polarization status changes from point a to point b. Then, although the storage node STN has the data "0" by the reference cell data driving signal PDC, there is no change in the polarization status because a previous potential is also 0 Volt(V).

Then, if the reference plate line driving signal RPL is disabled, both ends of the cell have 0 Volt (V), thereby the polarization status is changed to point c. Although the reference bit line has 0 Volt (V) by the precharge driving signal PRL, there is no voltage variation in both ends of the cell, there is no variation in the polarization status, therefore the data "0" is stored (See FIGS. 5 and GB).

Figure 1A:
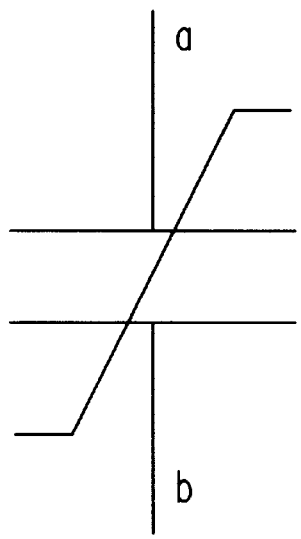
FIG. 1A is a symbol of a ferroelectric material capacitor.
Figure 1B:
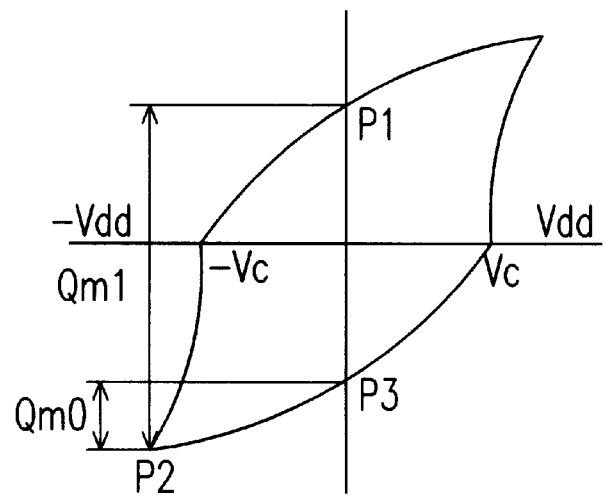
FIG. 1B is a hysteresis loop illustrating a relationship between a voltage and a charge quantity of the ferroelectric material capacitor.
Figure 2:
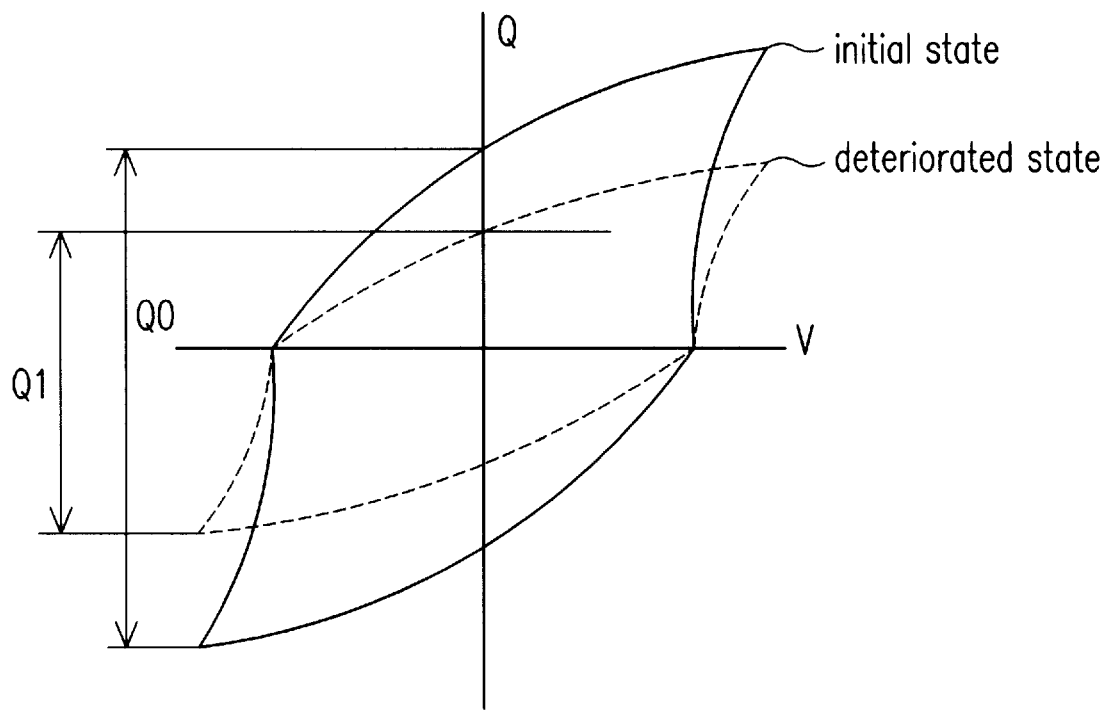
FIG. 2 shows a hysteresis loop of an initial ferroelectric material capacitor and a hysteresis loop of a deteriorated ferroelectric material capacitor.
Figure 3:
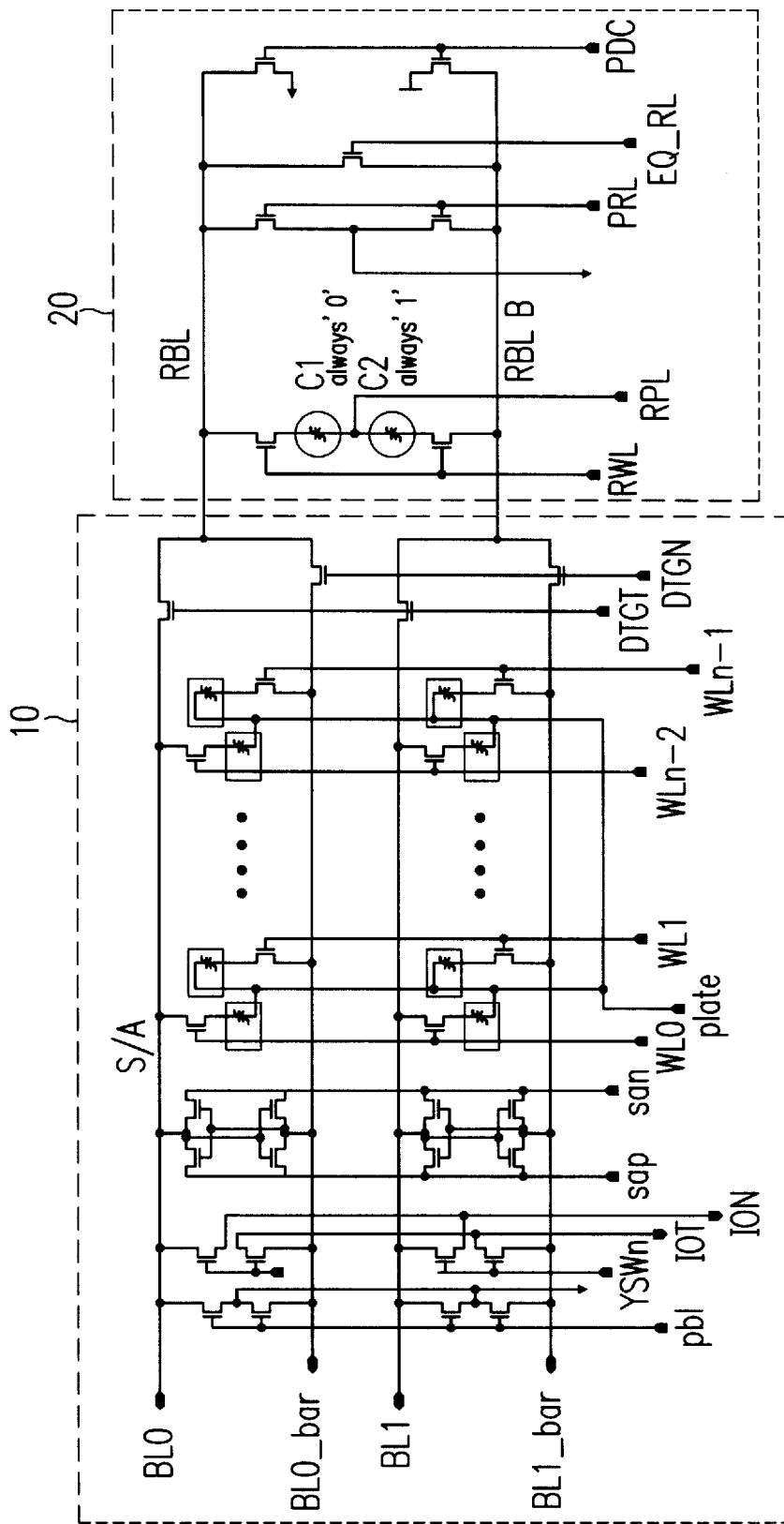
FIG. 3 is a circuit diagram illustrating a memory cell array and a reference voltage generator according to the prior art.
Figure 4A:
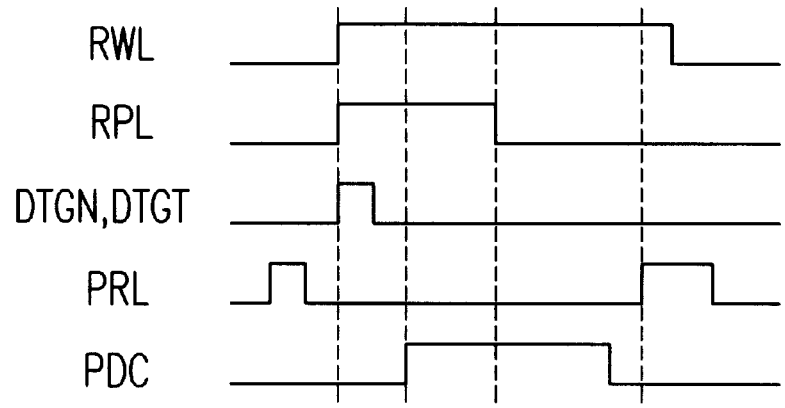
FIGS. 4A–4B illustrate a signal diagram for driving the prior reference voltage generator, and a voltage relation between both ends of the ferroelectric material capacitor by a driving signal in accordance with the present invention.
Figure 4A:
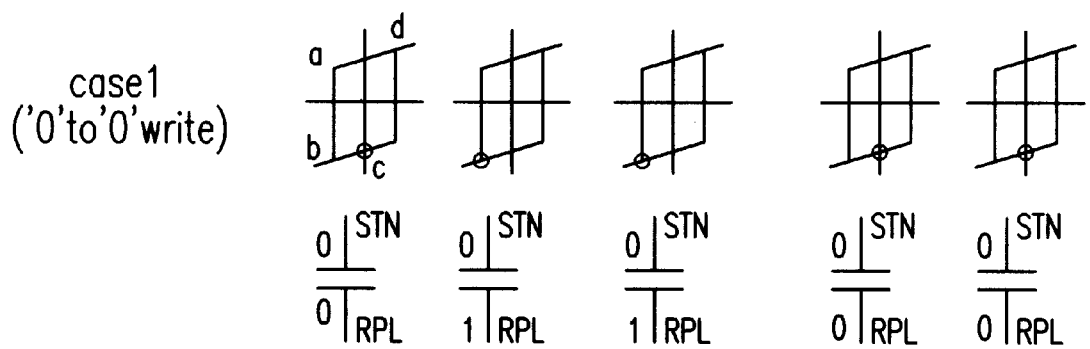
Figure 4B:
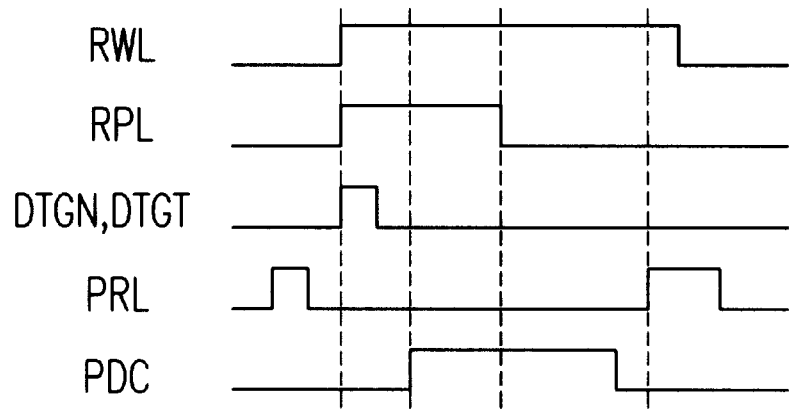
Figure 4B:
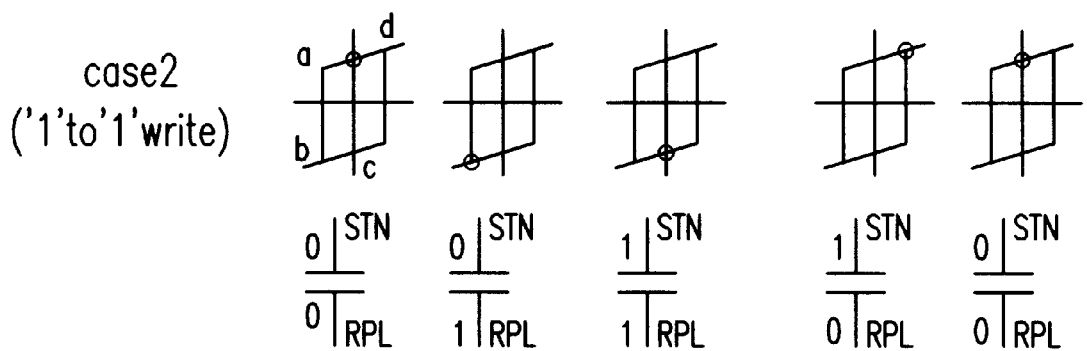

As described above, in the conventional art, since the data "1" is always stored in one specified reference cell of the two reference cells and the data "0" is also stored in the other reference cell, the cases 1 and 2 shown in FIGS. 4A–4B are generated. Accordingly, a looping which always repeats only status (a→b→c→d→a) is formed in the case 2 shown in FIGS. 4A–4B, thereby generating a fatigue phenomenon.

However, since the present invention alternately stores the data "0" and "1" in each reference cell, there are four kinds of cases, i.e., the case 1 having no looping because of a status change of (c→b→c), the cases 3 and 4 for looping only half cycle, and cases 2 for always repeating only a status (a→b→c→d→a). As a result, the present invention prevents a fatigue phenomenon from being excessively generated in specified cell, thereby enhancing a durability of a chip.

As described above, the present invention alternately stores data "0" and "1" in response to an address change of reference cells used in a reference voltage generator of a ferroelectric material memory device, and decreases the reference cell's characteristic drop caused by a fatigue phenomenon by half, thereby enhancing a durability and a reliability of a chip.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A reference voltage generator for a ferroelectric material memory device, comprising:
   a reference cell portion connected between two reference bit lines, said reference cell portion has a plurality of reference cells to store reference voltages;
   a reference cell data controller connected between the two reference bit lines, said reference cell data controller includes a plurality of switching means for alternately transmitting a power-supply voltage or a ground voltage to the first or second reference bit lines in response to a plurality of reference cell data control signals; and
   a reference cell data control signal generator for generating the plurality of reference cell data control signals to control the plurality of switching means of the reference cell data controller.

2. A reference voltage generator for a ferroelectric material memory device as set forth in claim 1, wherein the plurality of switching means of the reference cell data controller comprises:
   a plurality of first MOS transistors having a first electrode connected to the power-supply voltage, a second electrode connected to the ground voltage and gate connected to one of the reference cell data control signals; and
   a plurality of second MOS transistors having a first electrode connected to the ground voltage, a second electrode connected to the power-supply voltage and gate connected to one of the reference cell data control signals.

3. A reference voltage generator for a ferroelectric material memory device as set forth in claim 1, wherein:
   the reference cell data control signal generator receives an address signal to output the plurality of reference cell data control signals.

4. A reference voltage generator for a ferroelectric material memory device, comprising:
   a reference cell portion connected between two reference bit lines, said reference cell portion has a plurality of reference cells to store reference voltages;
   a pre-charge portion for pre-charging the two reference bit lines by the ground voltage;
   a reference bit line equalizer for equalizing the two reference bit lines;
   a reference cell data controller connected between the two reference bit lines, said reference cell data controller includes a plurality of switching means for alternately transmitting a power-supply voltage or a ground voltage to the first or second reference bit lines in response to a plurality of reference cell data control signals; and
   a reference cell data control signal generator for generating the plurality of reference cell data control signals to control a plurality of switching means of the reference cell data controller.

5. A reference voltage generator for a ferroelectric material memory device as set forth in claim 4, wherein the plurality of switching means of the reference cell data controller comprise:
   a plurality of first MOS transistors having a first electrode connected to the power-supply voltage, a second electrode connected to the ground voltage and gate connected to one of the reference cell data control signals; and
   a plurality of second MOS transistors having a first electrode connected to the ground voltage, a second electrode connected to the power-supply voltage and gate connected to one of the reference cell data control signals.

6. A reference voltage generator for a ferroelectric material memory device as set forth in claim 4, wherein:
   the reference cell data control signal generator receives an address signal to output the plurality of reference cell data control signals.

* * * * *